(12) United States Patent
Furuta

(10) Patent No.: US 8,592,717 B2
(45) Date of Patent: Nov. 26, 2013

(54) METHOD OF DIVIDING A WORKPIECE HAVING AN UNEVEN SURFACE

(75) Inventor: Kenji Furuta, Ota-Ku (JP)

(73) Assignee: Disco Corporation, Tokyo (JP)

( * ) Notice: Subject to any disclaimer, the term of this patent is extended or adjusted under 35 U.S.C. 154(b) by 317 days.

(21) Appl. No.: 13/048,465

(22) Filed: Mar. 15, 2011

(65) Prior Publication Data

US 2011/0226747 A1 Sep. 22, 2011

(30) Foreign Application Priority Data

Mar. 16, 2010 (JP) .................................. 2010-060002

(51) Int. Cl.
*B23K 26/38* (2006.01)
(52) U.S. Cl.
USPC ...................... 219/121.72; 438/463
(58) Field of Classification Search
USPC ......... 219/121.67, 121.72; 438/463; 427/554, 427/555
See application file for complete search history.

(56) References Cited

U.S. PATENT DOCUMENTS

| 7,303,977 B2 * | 12/2007 | Voronov et al. ................ 438/463 |
| 2005/0000952 A1 * | 1/2005 | Harter ...................... 219/121.73 |
| 2005/0272223 A1 * | 12/2005 | Fujii et al. ...................... 438/795 |
| 2006/0108338 A1 * | 5/2006 | Nishiwaki et al. ........ 219/121.72 |
| 2009/0242526 A1 * | 10/2009 | Baldwin ................... 219/121.67 |
| 2011/0163079 A1 * | 7/2011 | Ito ............................ 219/121.72 |
| 2012/0088354 A1 * | 4/2012 | Furuta ........................... 438/463 |

FOREIGN PATENT DOCUMENTS

| EP | 1550527 A1 * | 7/2005 |
| JP | 2002-192370 | 7/2002 |
| WO | WO-2009/078321 A1 * | 6/2009 |

\* cited by examiner

*Primary Examiner* — Geoffrey S Evans
(74) *Attorney, Agent, or Firm* — Greer, Burns & Crain, Ltd.

(57) ABSTRACT

A workpiece dividing method for dividing a workpiece having an uneven incident surface upon which a pulsed laser beam falls. The workpiece dividing method includes a coating step of applying a coating member to the incident surface of the workpiece, thereby planarizing the incident surface of the workpiece, the coating member transmitting the pulsed laser beam and having a refractive index close to that of the workpiece for the pulsed laser beam, a modified layer forming step of applying the pulsed laser beam to the workpiece from the side of the incident surface in the condition where a focal point of the pulsed laser beam is set inside the workpiece after performing the coating step, thereby forming a modified layer inside the workpiece, and a dividing step of applying an external force to the workpiece after performing the modified layer forming step, thereby dividing the workpiece as starting from the modified layer formed inside said workpiece as a break start point.

2 Claims, 7 Drawing Sheets

METHOD OF DIVIDING A WORKPIECE HAVING AN UNEVEN SURFACE

BACKGROUND OF THE INVENTION

1. Field of the Invention

The present invention relates to a workpiece dividing method for dividing a workpiece such as a semiconductor wafer.

2. Description of the Related Art

In a semiconductor device fabrication process, a plurality of crossing division lines called streets are formed on the front side of a substantially disk-shaped workpiece to thereby partition a plurality of regions where circuits such as ICs and LSIs are respectively formed. The workpiece is cut along the division lines to divide the regions where the circuits are formed from each other, thus obtaining individual semiconductor chips.

Cutting of the workpiece along the division lines is performed by using a cutting apparatus called a dicing saw, for example. In recent years, as another workpiece dividing method, a laser processing method using a pulse-shaped processing laser beam (pulsed laser beam) having a transmission wavelength to the workpiece has been carried out (see Japanese Patent No. 3408805, for example). In this laser processing method, the pulsed laser beam having an infrared region transmitting the workpiece is applied to the workpiece from one side thereof along the division lines in the condition where a focal point of the pulsed laser beam is set inside the workpiece, thereby continuously forming a modified layer inside the workpiece along each division line. Thereafter, an external force is applied to the workpiece, thereby dividing the workpiece along each division line where the modified layer is formed to reduce the strength.

SUMMARY OF THE INVENTION

However, when unevenness is present on a surface (incident surface) of the workpiece upon which the pulsed laser beam falls, the pulsed laser beam incident on the incident surface of the workpiece refracts at the interface between air and the workpiece, so that the pulsed laser beam is not sufficiently focused inside the workpiece, causing a reduction in processing quality. To cope with this problem, it is necessary in the related art to preliminarily grind the back side of the workpiece as the incident surface, thereby planarizing the incident surface. In the case that the workpiece is a silicon wafer, for example, it is necessary to grind the incident surface with an abrasive having a gain size of #2000 or higher. Such grinding is usually performed for the purpose of reducing the thickness of the workpiece. However, although the workpiece need not be reduced in thickness, grinding is required to planarize the incident surface in the above method. Further, there is a case that the workpiece cannot be ground according to its kind and that the laser processing method as disclosed in Japanese Patent No. 3408805 mentioned above cannot therefore be applied.

It is therefore an object of the present invention to provide a workpiece dividing method which can divide a workpiece by performing laser processing for forming a modified layer inside the workpiece even when unevenness is present on the incident surface of the workpiece.

In accordance with an aspect of the present invention, there is provided a workpiece dividing method for dividing a workpiece having an uneven incident surface upon which a pulsed laser beam falls, the workpiece dividing method including a coating step of applying a coating member to the incident surface of the workpiece, thereby planarizing the incident surface of the workpiece, the coating member transmitting the pulsed laser beam and having a refractive index close to that of the workpiece for the pulsed laser beam; a modified layer forming step of applying the pulsed laser beam to the workpiece from the side of the incident surface in the condition where a focal point of the pulsed laser beam is set inside the workpiece after performing the coating step, thereby forming a modified layer inside the workpiece; and a dividing step of applying an external force to the workpiece after performing the modified layer forming step, thereby dividing the workpiece as starting from the modified layer formed inside said workpiece as a break start point.

According to the present invention, the coating member having a refractive index close to that of the workpiece is applied to the incident surface of the workpiece, thereby planarizing the interface between the incident surface of the workpiece and air, so that the degree of refraction of the pulsed laser beam at the interface between the incident surface and the coating member can be reduced. Accordingly, the focusing accuracy of the pulsed laser beam at the focal point set inside the workpiece can be improved. As a result, the workpiece can be divided by performing laser processing for forming a modified layer in the workpiece even when unevenness is present on the incident surface of the workpiece.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

A workpiece dividing method according to a preferred embodiment of the present invention will now be described with reference to the drawings. The workpiece dividing method according to this preferred embodiment includes the steps of applying a pulsed laser beam to a workpiece as an object to be divided to thereby form modified layers in the workpiece and next applying an external force to the workpiece having these modified layers where the strength is reduced to thereby divide the workpiece.

Figure 1:
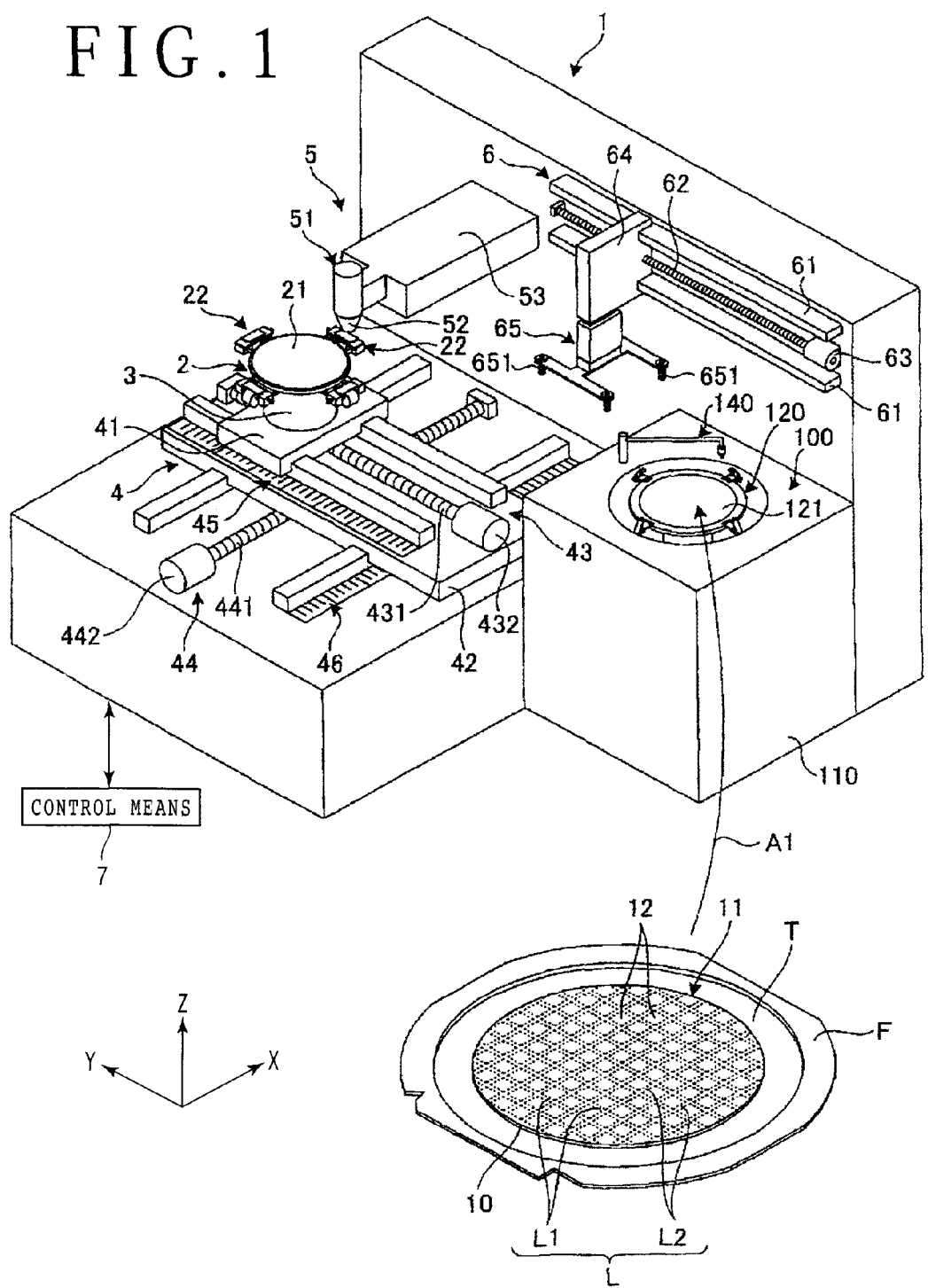
FIG. 1 is a schematic perspective view for illustrating the configuration of a semiconductor wafer and an essential part of a laser processing apparatus for forming modified layers in the semiconductor wafer.

FIG. 1 is a schematic perspective view for illustrating the configuration of a semiconductor wafer 10 as an example of the workpiece and an essential part of a laser processing apparatus 1 for forming the modified layers in the semiconductor wafer 10. As shown in FIG. 1, the semiconductor wafer 10 as an object to be divided in this preferred embodiment has a substantially circular shape. As shown in FIG. 1, the semiconductor wafer 10 is handled by the laser processing apparatus 1 in the condition where it is supported through a supporting tape T to an annular frame F. More specifically, the supporting tape T is formed from an expandable synthetic resin sheet, and its outer circumferential portion is supported to the annular frame F so as to close an inner opening of the annular frame F. The front side of the semiconductor wafer 10 is attached to the supporting tape T in the condition where the back side (upper surface as viewed in FIG. 1) 11 of the semiconductor wafer 10 is exposed. As shown by broken lines in FIG. 1, the front side of the semiconductor wafer 10 attached to the supporting tape T is partitioned into a plurality of rectangular areas by a plurality of crossing division lines L composed of first and second division lines L1 and L2 perpendicular to each other, and a plurality of devices 12 are formed in these plural rectangular areas, respectively.

The workpiece in the present invention is not especially limited. Examples of the workpiece include a semiconductor wafer of silicon, gallium arsenide (GaAs), etc., an adhesive member such as DAF (Die Attach Film) provided on the back side of a wafer for chip mounting, a semiconductor product package, an inorganic material substrate of ceramic, glass, sapphire ($Al_2O_3$), etc., various electronic parts such as an LCD driver, and various work materials required to achieve a processing positional accuracy on the order of micrometers.

The laser processing apparatus 1 performs the step of applying a pulsed laser beam to the back side 11 of the semiconductor wafer 10 as an incident surface along the crossing division lines L formed on the front side of the semiconductor wafer 10 and partitioning the device 12 to thereby form the modified layers in the semiconductor wafer 10 along the division lines L. In this preferred embodiment, the laser processing apparatus 1 has an integral configuration including a coating apparatus 100 for applying a coating member to the back side 11 of the semiconductor wafer 10 prior to laser processing to thereby planarize the back side 11.

Figure 2:
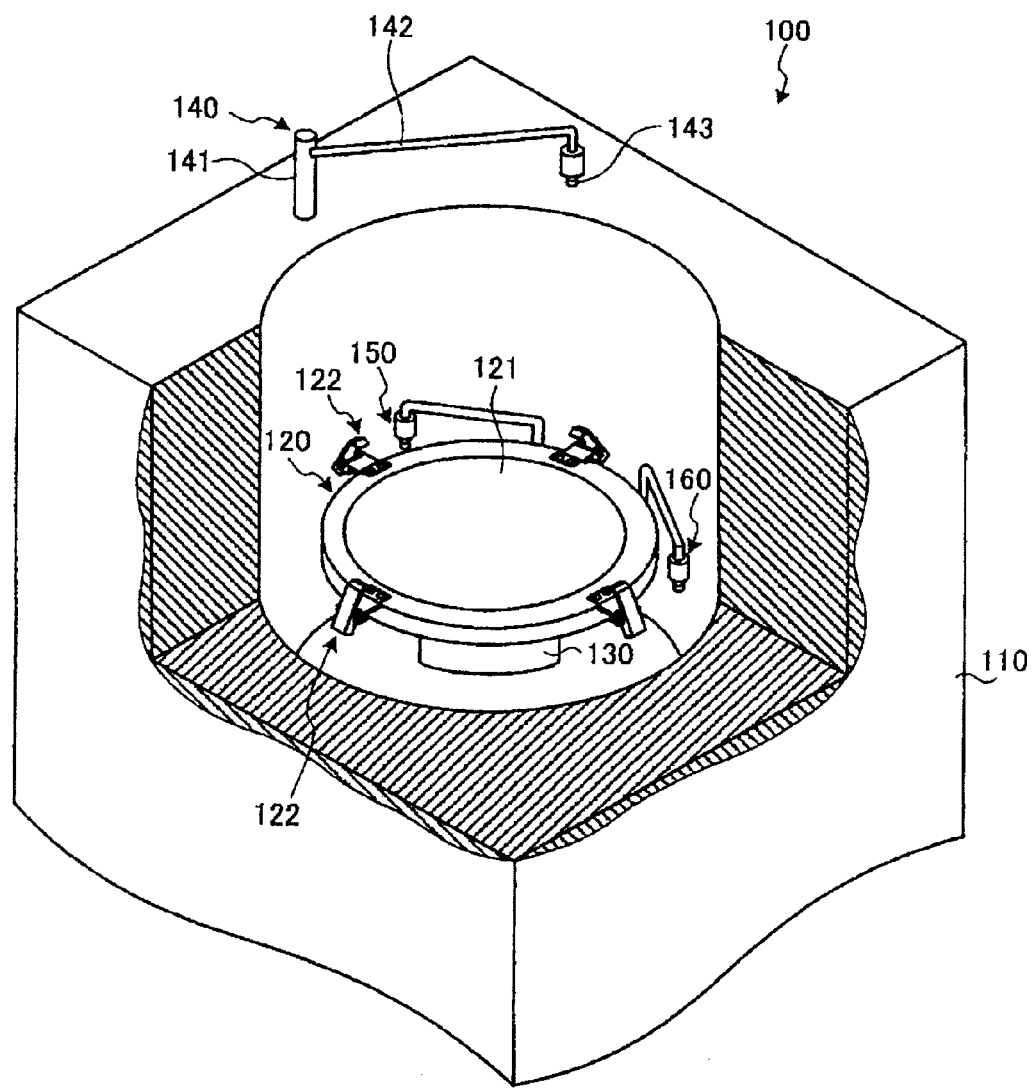
FIG. 2 is a schematic perspective view for illustrating a retracted position of a holding table constituting a coating apparatus.

The coating apparatus 100 will now be described. FIG. 2 is a schematic perspective view for illustrating a retracted position of a holding table 120 constituting the coating apparatus 100, wherein a housing 110 is partially cut away to show the inside of the housing 110. As shown in FIGS. 1 and 2, the coating apparatus 100 includes the holding table 120 for holding the semiconductor wafer 10 and coating member supplying means 140 for supplying the coating member to the back side 11 of the semiconductor wafer 10 held by the holding table 120.

The holding table 120 primarily includes a chuck table having a size corresponding to the size of the semiconductor wafer 10. The holding table 120 has an upper surface as a holding surface 121 for holding the semiconductor wafer 10 thereon and a plurality of clamps 122 provided along the outer circumference of the holding surface 121 for fixing the annular frame F. The semiconductor wafer 10 placed on the holding surface 121 is held under suction by suction means (not shown). The semiconductor wafer 10 is carried to the holding table 120 by carrying means (not shown) as shown by an arrow A1 in FIG. 1 in the condition where the back side 11 of the semiconductor wafer 10 is exposed and the front side of the semiconductor wafer 10 is attached to the supporting tape T. Thus, the semiconductor wafer 10 supported through the supporting tape T to the annular frame F is held under suction on the holding surface 121 of the holding table 120.

The holding table 120 for holding the semiconductor wafer 10 on the holding surface 121 is provided on the upper end of a cylindrical rotating portion 130. The rotating portion 130 contains a pulse motor (not shown) and is rotatable about a vertical axis extending in the Z-axis direction, so that the holding table 120 is rotatable in a horizontal plane by the rotation of the rotating portion 130. The holding table 120 is supported through the rotating portion 130 so as to be vertically movable in the Z-axis direction by an elevating portion (not shown), so that the holding surface 121 is selectively set in a coating position where the height of the holding surface 121 is the same as that of the upper surface of the housing 110 as shown in FIG. 1 and in a retracted position where the holding surface 121 is lowered from the coating position and retracted in the housing 110 as shown in FIG. 2. The housing 110 is a boxlike member having a cylindrical space for accommodating the vertically movable holding table 120. The rotating portion 130 and the elevating portion (not shown) mentioned above are contained in the housing 110.

As shown in FIG. 2, the coating member supplying means 140 includes a support shaft 141 provided in the vicinity of the upper opening of the cylindrical space of the housing 110 so as to be rotatable about a vertical axis, an arm 142 having one end connected to the upper end of the support shaft 141 and extending horizontally along the upper surface of the housing 110, and a nozzle 143 provided at the other end of the arm 142 so that its nozzle opening is oriented downward. Although not shown, the coating member supplying means 140 further includes a coating member source and a pipe for feeding the coating member from the coating member source to the nozzle 143. In a coating step to be described later, the support shaft 141 is rotated to swing the arm 142 and thus the nozzle 143 is moved to a position above the center of the holding surface 121 set in the coating position. In this condition, the coating member is supplied from the nozzle 143 to the back side 11 of the semiconductor wafer 10 held on the holding surface 121.

The coating apparatus 100 functions also as a cleaning apparatus for cleaning the semiconductor wafer 10 after laser processing. Accordingly, the coating apparatus 100 further includes a cleaning water nozzle 150 for supplying a cleaning water to the back side 11 of the semiconductor wafer 10 held on the holding surface 121 set in the retracted position and an air nozzle 160 for supplying air from an air source.

Referring back to FIG. 1, the laser processing apparatus 1 having the coating apparatus 100 as mentioned above includes a holding table 2 for holding the semiconductor wafer 10, holding table driving means 4 for moving the holding table 2 both in the X-axis direction (feeding direction) and in the Y-axis direction (indexing direction), and laser applying means 5 for applying a pulsed laser beam to the back side 11 of the semiconductor wafer 10 held by the holding table 2.

Like the holding table 120 of the coating apparatus 100, the holding table 2 primarily includes a chuck table having a size corresponding to the size of the semiconductor wafer 10. The holding table 2 has an upper surface as a holding surface 21 for holding the semiconductor wafer 10 thereon and a plurality of clamps 22 provided along the outer circumference of the holding surface 21 for fixing the annular frame F. The semiconductor wafer 10 placed on the holding surface 21 is held under suction by suction means (not shown). The semiconductor wafer 10 is carried to the holding table 21 in the condition where the back side 11 of the semiconductor wafer 10 is exposed and the front side of the semiconductor wafer 10 is attached to the supporting tape T. Thus, the semiconductor wafer 10 supported through the supporting tape T to the annular frame F is held under suction on the holding surface 21 of the holding table 2.

The semiconductor wafer 10 is carried to the holding table 2 after the coating member is applied to the back side 11 of the semiconductor wafer 10 by the coating apparatus 100. Transportation of the semiconductor wafer 10 between the holding table 120 of the coating apparatus 100 and the holding table 2 is performed by transporting means 6. The configuration of the transporting means 6 may be the same as that of any transporting means generally used. For example, the transporting means 6 includes a pair of guide rails 61, a ball screw 62 extending parallel to the guide rails 61 so as to be interposed therebetween, a pulse motor 63 for rotationally driving the ball screw 62, a moving block 64 slidably engaged with the guide rails 61 and adapted to be moved between a position above the holding table 120 and a position above the holding table 2 by operating the pulse motor 63, and holding means 65 mounted on the lower end of the moving block 64 for vertically movably holding a plurality of transporting pads 651 for holding the annular frame F under suction. The holding table 2 for holding the semiconductor wafer 10 on the holding surface 21 is provided on the upper end of a cylindrical member 3 so as to be rotatable about a vertical axis by a pulse motor (not shown) provided in the cylindrical member 3.

The holding table driving means 4 includes two sliding blocks 41 and 42 arranged on the upper and lower stages. The holding table 2 is mounted on these two sliding blocks 41 and 42 through the cylindrical member 3. The holding table driving means 4 includes indexing means 43 including a ball screw 431 and a pulse motor 432. The sliding block 41 is movable in the Y-axis direction by the indexing means 43. The indexing means 43 is driven to move the sliding block 41, thereby moving the holding table 2 in the Y-axis direction relative to the laser applying means 5. Thus, the holding table 2 mounted on the sliding block 41 and the laser applying means 5 are relatively moved in the Y-axis direction.

The holding table driving means 4 further includes feeding means 44 including a ball screw 441 and a pulse motor 442. The sliding block 42 is movable in the X-axis direction by the feeding means 44. The feeding means 44 is driven to move the sliding block 42, thereby moving the holding table 2 in the X-axis direction relative to the laser applying means 5. Thus, the holding table 2 mounted on the sliding block 42 and the laser applying means 5 are relatively moved in the X-axis direction.

The indexing means 43 is provided with index amount detecting means 45 for detecting the index amount of the holding table 2. The index amount detecting means 45 includes a linear scale extending in the Y-axis direction and a read head provided on the sliding block 41 for reading the linear scale in moving with the sliding block 41. Similarly, the feeding means 44 is provided with feed amount detecting means 46 for detecting the feed amount of the holding table 2. The feed amount detecting means 46 includes a linear scale extending in the X-axis direction and a read head provided on the sliding block 42 for reading the linear scale in moving with the sliding block 42.

The laser applying means 5 includes a laser applying unit 51 and a supporting member 53 for supporting the laser applying unit 51 above the holding table 2. The laser applying unit 51 functions to apply a pulsed laser beam to the semiconductor wafer 10 held on the holding surface 21, thereby forming the modified layers along the division lines L. The laser applying unit 51 includes focusing means 52 opposed to the back side 11 of the semiconductor wafer 10 held on the holding surface 21. The focusing means 52 includes a focusing lens for focusing the pulsed laser beam oscillated by pulsed laser oscillating means included in the laser applying unit 51. The pulsed laser oscillating means is provided by a YAG laser oscillator or a YVO4 laser oscillator, for example, and it functions to oscillate a pulsed laser beam having a predetermined wavelength (e.g., 1064 nm) transmitting the semiconductor wafer 10, from the back side 11 of the semiconductor wafer 10 positioned below the focusing means 52.

The laser applying unit 51 is supported to the supporting member 53 so as to be movable in the Z-axis direction. Accordingly, the focusing lens included in the focusing means 52 can be moved perpendicularly to the holding surface 21. Thus, the laser applying means 5 is configured so that it can adjust the focal position (Z position) of the pulsed laser beam focused by the focusing lens.

The laser processing apparatus 1 is provided with control means 7 for controlling the operation of various components of the laser processing apparatus 1 to centrally control the laser processing apparatus 1. The control means 7 is provided by a microcomputer including a memory storing various data required for the operation of the laser processing apparatus 1. That is, the laser processing apparatus 1 performs a holding step, a coating step, and a modified layer forming step under the control of the control means 7.

Figure 3:
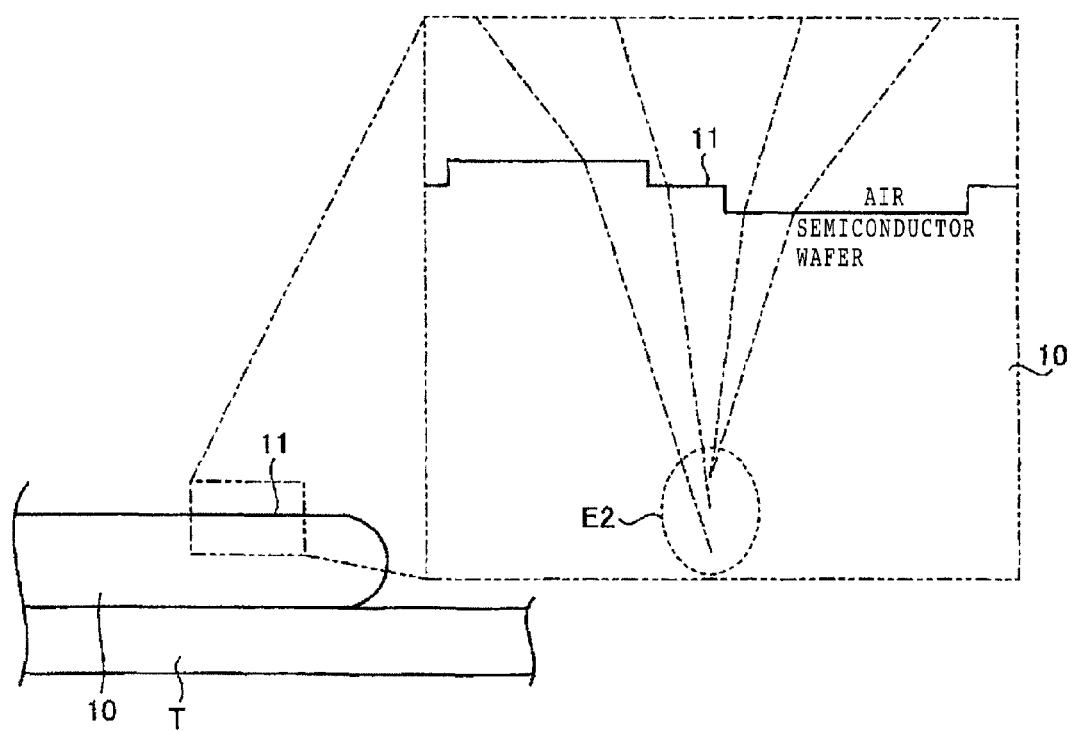
FIG. 3 is a schematic sectional view for illustrating a problem in the related art.
Figure 4:
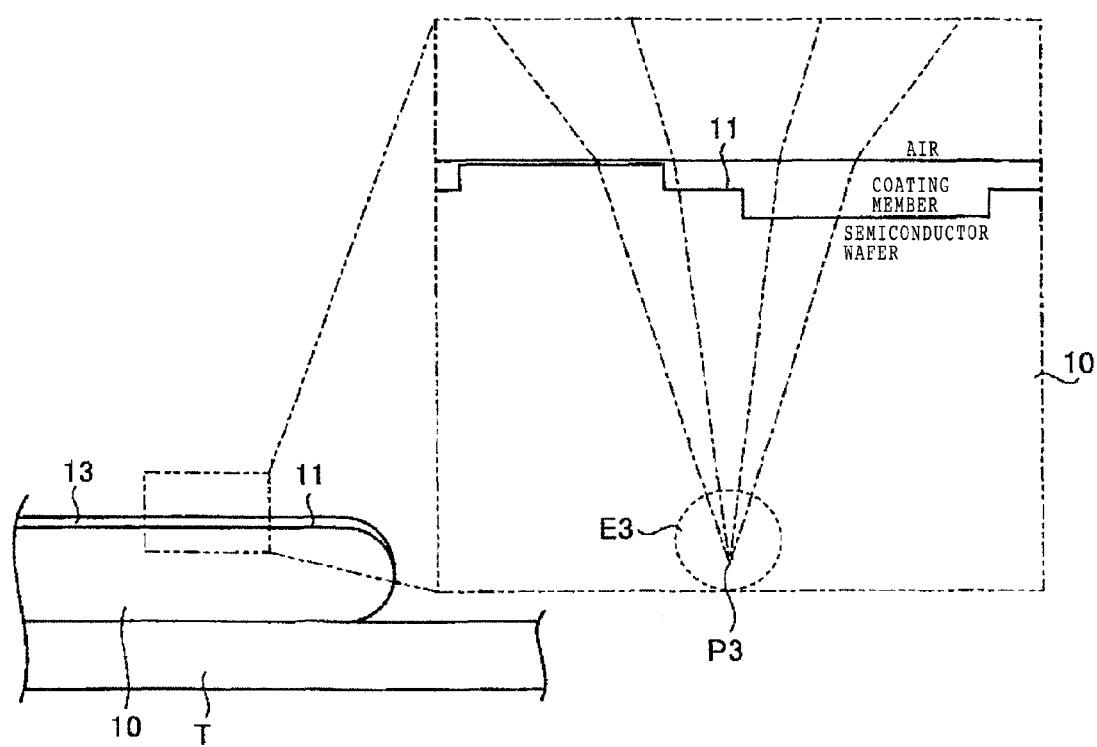
FIG. 4 is a schematic sectional view for illustrating laser processing in a preferred embodiment of the present invention.

The laser processing to be performed by the laser processing apparatus 1 in the workpiece dividing method according to this preferred embodiment will now be described as compared with a problem in the related art. FIG. 3 illustrates a problem in the related art, wherein a cross section of the semiconductor wafer 10 is shown and a part of this cross section is enlarged. In this enlarged cross section, the optical paths of the pulsed laser beam applied to the inside of the semiconductor wafer 10 are shown by single dot & dash lines. In contrast, FIG. 4 illustrates the laser processing in this preferred embodiment, wherein a cross section of the semiconductor wafer 10 is shown and a part of this cross section is enlarged. In this enlarged cross section, the optical paths of the pulsed laser beam applied to the inside of the semiconductor wafer 10 are shown by single dot & dash lines.

In this preferred embodiment, it is assumed that unevenness is present on the back side 11 of the semiconductor wafer 10 as an object to be divided. The refractive indices of air and the semiconductor wafer 10 for the pulsed laser beam are different from each other. Accordingly, when the pulsed laser beam is applied to the semiconductor wafer 10 from the back side 11, the optical paths of the pulsed laser beam refract at the interface between air and the semiconductor wafer 10. In the case that the pulsed laser beam is directly applied to an uneven portion of the back side 11 of the semiconductor wafer 10 as shown in FIG. 3, the pulsed laser beam is insufficiently focused as shown in a broken-line area E2 because of variations in height of the back side 11 in the above-mentioned uneven portion.

To the contrary, in the workpiece dividing method according to this preferred embodiment as shown in FIG. 4, a coating member 13 is applied to the whole surface of the back side 11 of the semiconductor wafer 10 prior to laser processing, thereby planarizing the back side 11 (the coating step to be described later). The refractive index of the coating member 13 for the pulsed laser beam is preferably set to a value close to that of the semiconductor wafer 10. That is, a large difference in refractive index between the coating member 13 and the semiconductor wafer 10 is improper. Accordingly, the interface between the back side 11 of the semiconductor wafer 10 and air can be planarized by the coating member 13, and the degree of refraction of the pulsed laser beam at the interface between the back side 11 of the semiconductor wafer 10 and the coating member 13 can be reduced. As a result, the pulsed laser beam can be sufficiently focused at a predetermined focal point P3 as a focal position at a predetermined depth in the semiconductor wafer 10 as shown in a broken-line area E3 in FIG. 4.

Specific examples of the coating member 13 include polyimide, optical plastic, and PVA (Poly Vinyl Alcohol). The refractive index of the workpiece (the semiconductor wafer 10 in this preferred embodiment) as an object to be divided for the pulsed laser beam differs according to the kind of the workpiece. For example, the refractive index of silicon is about 4.0. Accordingly, in the case that a silicon wafer is used as the object to be divided, a coating member having a refractive index close to 4.0 for the pulsed laser beam is preferably selected as the coating member 13. Further, the refractive index of sapphire is about 1.9. Accordingly, in the case that a sapphire substrate is used as the object to be divided, a coating member having a refractive index close to 1.9 for the pulsed laser beam is preferably selected as the coating member 13.

More preferably, the refractive index of the coating member for the pulsed laser beam is set to a value close to that of the workpiece (the semiconductor wafer 10 in this preferred embodiment) as the object to be divided rather than that of air. That is, in the case that the refractive index of the coating member for the pulsed laser beam is set close to that of the workpiece rather than that of air, the degree of refraction of the pulsed laser beam at the interface between the back side of the workpiece and the coating member can be made smaller than the degree of refraction of the pulsed laser beam at the interface between the coating member and air, so that the pulsed laser beam can be focused at the predetermined focal point in the workpiece with higher accuracy. Accordingly, the laser processing for the workpiece can be performed with higher quality, and the accuracy of division of the workpiece can therefore be improved. The refractive index of air (at 0° C. and 1 atm pressure) for the pulsed laser beam used for the laser processing in this preferred embodiment is about 1.0. Accordingly, by adopting the coating member having a refractive index of greater than or equal to 1.0 and less than 7.0 in consideration of the fact that the refractive index of silicon is about 4.0, it is considered that the performance of laser processing can be improved. However, when the refractive index of the coating member is closer to 4.0, it is expected that the performance of laser processing can be improved more.

The present inventors conducted a test by applying a coating member having a refractive index of about 1.5 with a film thickness of about 1.3 μm to the back side of a silicon wafer to thereby planarize the back side of the silicon wafer and next applying a pulsed laser beam to the silicon wafer from its back side. Further, a comparison was also conducted by directly applying a pulsed laser beam to the silicon wafer from its back side without applying the coating member to perform laser processing. As a result, the modified layers can be better formed in the silicon wafer according to the present invention as compared with the case of not applying the coating member.

There will now be described the specific steps of the workpiece dividing method according to this preferred embodiment. In the workpiece dividing method according to this preferred embodiment, a holding step, a coating step, and a modified layer forming step are sequentially performed by the laser processing apparatus 1 mentioned above. Thereafter, a dividing step is performed to divide the semiconductor wafer 10 as the workpiece along the division lines L. Thereafter, a coating member removing step is performed to remove the coating member applied to the back side 11 of the semiconductor wafer 10 in the coating step.

Figure 5:
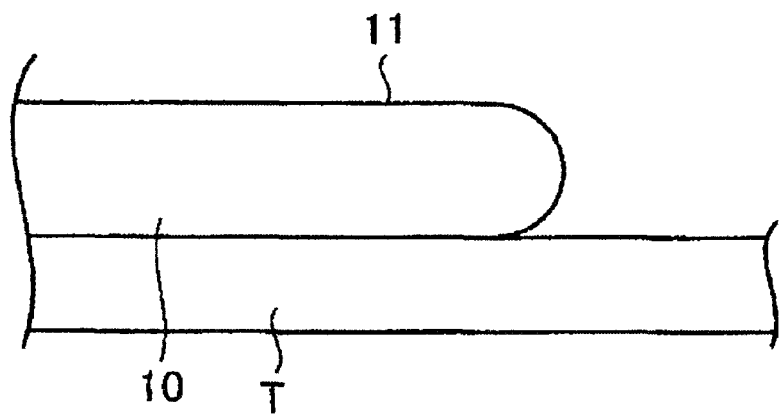
FIG. 5 is a schematic sectional view for illustrating a holding step.
Figure 6:
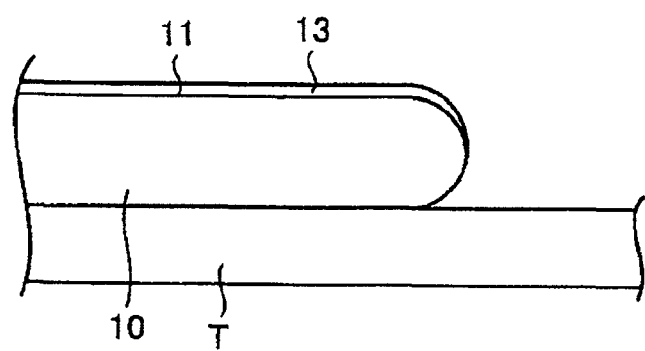
FIG. 6 is a schematic sectional view for illustrating a coating step.
Figure 7:
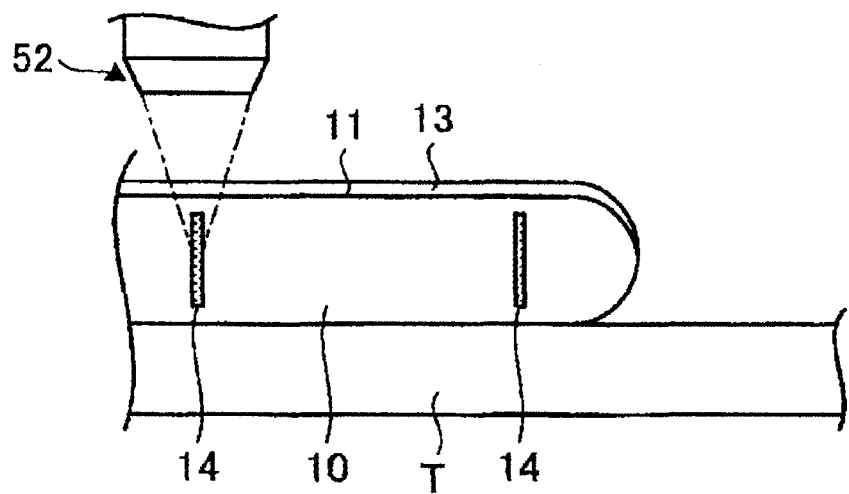
FIG. 7 is a schematic sectional view for illustrating a modified layer forming step.
Figure 8:
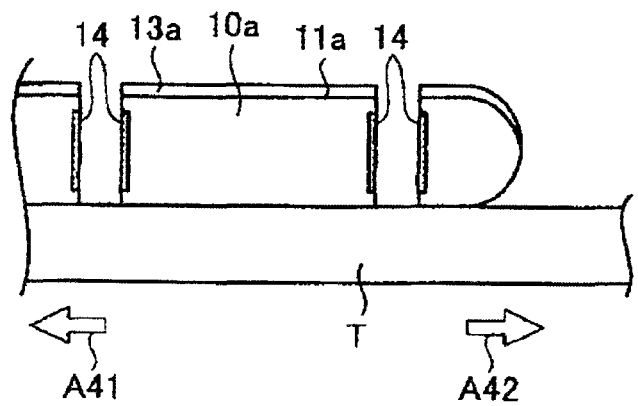
FIG. 8 is a schematic sectional view for illustrating a dividing step.
Figure 9:
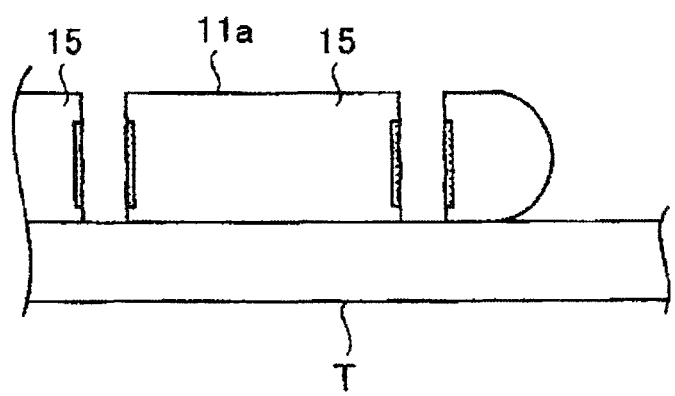
FIG. 9 is a schematic sectional view for illustrating a coating member removing step.

FIGS. 5 to 9 are sectional views of the semiconductor wafer 10 in these steps of the workpiece dividing method according to this preferred embodiment. More specifically, FIG. 5 is a sectional view for illustrating the holding step, FIG. 6 is a sectional view for illustrating the coating step, FIG. 7 is a sectional view for illustrating the modified layer forming step, FIG. 8 is a sectional view for illustrating the dividing step, and FIG. 9 is a sectional view for illustrating the coating member removing step.

(Holding Step)

Prior to the holding step, the holding table 120 in the coating apparatus 100 is set to the coating position by the elevating portion (not shown), and the semiconductor wafer 10 is next carried to the holding table 120 by the carrying means (not shown) in the condition where the back side 11 is oriented upward, so that the semiconductor wafer 10 is placed on the holding surface 121. In the holding step, the suction means (not shown) for the holding table 120 is driven to hold the semiconductor wafer 10 through the supporting tape T attached to the front side of the semiconductor wafer 10 on the holding surface 121 under suction. Accordingly, the semiconductor wafer 10 is held on the holding surface 121 in the condition where the back side 11 is exposed as shown in FIG. 5. Further, in the holding step, the coating member supplying means 140 is driven to rotate the support shaft 141, thereby swinging the arm 142 to move the nozzle 143 to a position above the center of the holding surface 121.

(Coating Step)

In the coating step subsequent to the holding step, the coating member supplying means 140 is driven to discharge a predetermined amount of coating member from the nozzle 143, thereby supplying the coating member to the back side 11 of the semiconductor wafer 10 held on the holding surface 121. Thereafter, the elevating portion (not shown) is driven to lower the holding table 120 to the retracted position. Thereafter, the rotating portion 130 is driven to rotate the holding table 120 at a predetermined speed for a predetermined time, thereby producing a centrifugal force to spread the coating member on the whole surface of the back side 11. The rotation speed and rotation time of the holding table 120 are suitably set according to the film thickness of the coating member. The film thickness of the coating member may also be suitably set. However, it is preferably set to a minimum film thickness required for planarization of the uneven back side 11 of the semiconductor wafer 10. For example, according to the test conducted by the present inventors, a good processing result was obtained by setting the film thickness of the coating member to about 1.3 μm. By performing the coating step mentioned above, the coating member 13 having a desired film thickness is applied to the whole surface of the back side 11 of the semiconductor wafer 10, thereby planarizing the back side 11. Most of the coating member supplied to the back side 11 of the semiconductor wafer 10 is scattered from the semiconductor wafer 10 by the centrifugal force due to the rotation of the holding table 120. However, since the holding table 120 is set in the retracted position inside the housing 110, there is no possibility that the coating member 13 may be scattered outside of the housing 110.

(Modified Layer Forming Step)

Prior to the modified layer forming step, the holding table 120 in the coating apparatus 100 is raised to the coating position by the elevating portion (not shown). Thereafter, the transporting means 6 is driven to transport the semiconductor wafer 10 from the holding table 120 to the holding table 2, so that the semiconductor wafer 10 is placed on the holding surface 21. The suction means (not shown) for the holding table 2 is next driven to hold the semiconductor wafer 10 through the supporting tape T on the holding surface 21 under suction. Thereafter, the pulse motor (not shown) provided in the cylindrical member 3 is driven to adjust the orientation of the semiconductor wafer 10 held on the holding surface 21 so that the first division lines L1 of the crossing division lines L extend in the X-axis direction. In the modified layer forming step, the holding table driving means 4 is driven to move the holding table 2 in the X-axis direction and/or the Y-axis direction, thereby positioning one of the first division lines L1 as a target division line directly below the focusing means 52.

Prior to positioning of the target division line, it is necessary to detect the division lines L formed on the front side of the semiconductor wafer 10. The semiconductor wafer 10 is held on the holding surface 21 in the condition where the back side 11 is exposed. Accordingly, in the case that the semiconductor wafer 10 is a silicon wafer, an infrared camera (not shown) is used to pass infrared light through the semiconductor wafer 10 held on the holding surface 21, thereby imaging the front side of the semiconductor wafer 10. Image data obtained by this imaging is subjected to image processing such as pattern matching to thereby detect the division lines L. By detecting the division lines L in this manner, the target division line is positioned directly below the focusing means 52. In this case, it is sufficient that the division lines L set on the front side of the semiconductor wafer 10 can be detected. Accordingly, a visible light camera or the like may be suitably used according to the kind of the semiconductor wafer 10.

Thereafter, the supporting member 53 is moved to a predetermined Z position so that the pulsed laser beam is focused at a predetermined depth in the semiconductor wafer 10. Thus, the focal point of the focusing lens in the focusing means 52 is adjusted to the position at the predetermined depth in the semiconductor wafer 10. Thereafter, the pulsed laser beam is applied to the semiconductor wafer 10 by the laser applying unit 51 as feeding the holding table 2 in the X-axis direction. Accordingly, the pulsed laser beam is applied along the target division line in the condition where it is focused at the predetermined depth in the semiconductor wafer 10, thereby forming a modified layer in the semiconductor wafer 10 along the target division line.

Thereafter, the remaining first division lines L1 are stepwise positioned directly below the focusing means 52 to similarly apply the pulsed laser beam to the semiconductor wafer 10, thereby forming modified layers along the remaining first division lines L1. After thus forming the modified layers along all of the first division lines L1, the holding table 2 is rotated 90° to thereby change the orientation of the semiconductor wafer 10 so that the second division lines L2 extend in the X-axis direction. Thereafter, the second division lines L2 are stepwise positioned directly below the focusing means 52 to similarly apply the pulsed laser beam to the semiconductor wafer 10, thereby forming modified layers along the second division lines L2. Each modified layer mentioned above means a region different from its ambient region in density, refractive index, mechanical strength, or any other physical properties. Examples of each modified layer include a melted region, cracked region, breakdown region, and refractive index changed region. These regions may be present in a mixed condition.

By performing the modified layer forming step mentioned above, modified layers 14 are formed in the semiconductor wafer 10 along the crossing division lines L as shown in FIG. 7. FIG. 7 shows a cross section of the semiconductor wafer 10 held on the holding surface 21 as taken in the Y-axis direction, wherein the modified layers 14 shown in FIG. 7 are formed along the division lines extending in the X-axis direction (the direction perpendicular to the sheet of FIG. 7).

(Dividing Step)

In the dividing step subsequent to the modified layer forming step, an external force is applied to the semiconductor wafer 10 to divide the semiconductor wafer 10 as starting from the modified layers 14 as a break start point. This dividing step is performed by a dividing apparatus. The dividing apparatus is so configured as to radially pull the outer circumference of the supporting tape T attached to the front side of the semiconductor wafer 10, thereby radially expanding the supporting tape T to apply a radial tensile force to the semiconductor wafer 10.

Prior to the dividing step, the semiconductor wafer 10 having the modified layers 14 is held by a holding table constituting the dividing apparatus. Like the holding table 2, the holding table of the dividing apparatus has an upper surface as a holding surface for holding the semiconductor wafer 10 through the supporting tape T under suction. The semiconductor wafer 10 is carried to the holding table in the condition where the back side 11 is oriented upward. In the dividing step, the supporting tape T attached to the front side of the semiconductor wafer 10 is expanded as shown by arrows A41 and A42 in FIG. 8 by the dividing apparatus to thereby apply an external force to the semiconductor wafer 10. As a result, the semiconductor wafer 10 is broken along the division lines L where the modified layers 14 are formed to reduce the strength, thus obtaining chips 10a. That is, the semiconductor wafer 10 is divided into a plurality of individual devices.

(Coating Member Removing Step)

In the coating member removing step, a cleaning fluid is used to clean the back side 11a of each chip 10a shown in FIG. 8 and remove the coating member 13a from the back side 11a of each chip 10a. The cleaning fluid may be selected according to the material of the coating member 13a. As a result, the coating member 13a present on the back side 11a of each chip 10a is removed by the cleaning fluid to expose the back side 11a as shown in FIG. 9.

In the case of using a water-soluble material such as PVA as the coating member 13, the coating member removing step can be performed by the laser processing apparatus 1. As described above, the coating apparatus 100 constituting the laser processing apparatus 1 has a function as a cleaning apparatus. Accordingly, by carrying the semiconductor wafer 10 to the holding table 120 after performing the dividing step, the coating member removing step can be performed by the laser processing apparatus 1. Further, in this preferred embodiment, the coating member 13a is removed from the back side 11a of each chip 10a in the coating member removing step after dividing the semiconductor wafer 10 into the chips 10a in the dividing step. As a modification, the coating member removing step may be performed before the dividing step. That is, the dividing step may be performed after removing the coating member 13 from the back side 11 of the semiconductor wafer 10. In this case, by using a water-soluble material such as PVA as the coating member 13 and transporting the semiconductor wafer 10 to the holding table 120 by the transporting means 6 after performing the modified layer forming step, the coating member removing step can be performed by the laser processing apparatus 1.

The coating member removing step using the coating apparatus 100 of the laser processing apparatus 1 will now be described. First, the semiconductor wafer 10 is placed on the holding surface 121 of the holding table 120 after performing the dividing step or the modified layer forming step. The suction means (not shown) for the holding table 120 is next driven to hold the semiconductor wafer 10 through the supporting tape T on the holding surface 121 under suction. The elevating portion (not shown) is next driven to lower the holding table 120 to the retracted position. The cleaning water nozzle 150 and the air nozzle 160 are next positioned above the holding surface 121 of the holding table 120 set in the retracted position. Thereafter, the rotating portion 130 is driven to rotate the holding table 120. At the same time, cleaning water and air are respectively discharged from the cleaning water nozzle 150 and the air nozzle 160 toward the back side 11 of the semiconductor wafer 10. As a result, the back side 11 of the semiconductor wafer 10 is cleaned and the coating member 13 is removed from the back side 11.

According to this preferred embodiment mentioned above, the coating member 13 having a refractive index close to that of the semiconductor wafer 10 for the pulsed laser beam is applied to the back side 11 of the semiconductor wafer 10, thereby planarizing the back side 11 of the semiconductor wafer 10. Thereafter, the pulsed laser beam is applied to the semiconductor wafer 10 from the back side 11 planarized above, thereby forming the modified layers 14 in the semiconductor wafer 10 along the division lines L. Accordingly, the pulsed laser beam can be sufficiently focused at a predetermined focal position in the semiconductor wafer 10 to thereby perform laser processing for forming the modified layers 14 in the semiconductor wafer 10 whose back side 11 has unevenness. Thereafter, the semiconductor wafer 10 can be divided as starting from the modified layers 14 reduced in strength. Accordingly, it is not necessary to grind a workpiece and thereby planarize the back side thereof. Further, even when the workpiece is a workpiece that cannot be ground, laser processing for forming the modified layers in the workpiece can be performed without planarizing (grinding) the back side of the workpiece.

There is a case that debris is produced in dividing the semiconductor wafer 10 in the dividing step and that the deposition of the debris to the back side 11 may have an adverse effect on the quality of the devices. According to this preferred embodiment, however, the coating member 13 applied to the back side 11 of the semiconductor wafer 10 functions also as a protective film for protecting the devices from the debris produced in the dividing step.

In this preferred embodiment, the back side 11 of the semiconductor wafer 10 is used as an incident surface. Examples of such a case that the back side of a workpiece is used as an incident surface to perform laser processing includes the following cases. In one case, a structure is provided on the front side of a workpiece as in MEMS (Micro Electro Mechanical Systems) and a pulsed laser beam cannot be applied to the workpiece from the front side thereof so as to be focused inside the workpiece. In another case, devices are formed on the front side of a workpiece as in a sapphire substrate whose front side is formed with a light emitting layer as the devices, so that it is undesired to apply a pulsed laser beam to the devices formed on the front side of the workpiece. However, in actual laser processing, there is a case that a pulsed laser beam is applied to a workpiece from the front side thereof to form modified layers in the workpiece. The present invention is applicable also to such a case that the front side of a workpiece is used as an incident surface to perform laser processing.

As described above, the workpiece dividing method of the present invention is suitable for dividing of a workpiece by laser processing for forming modified layers in the workpiece even when unevenness is present on the incident surface of the workpiece.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A workpiece dividing method for dividing a workpiece having an uneven incident surface upon which a pulsed laser beam falls, said workpiece dividing method comprising:
  a coating step of applying a coating member to said uneven incident surface of said workpiece, thereby planarizing said uneven incident surface of said workpiece, said coating member transmitting said pulsed laser beam and having a refractive index close to that of said workpiece for said pulsed laser beam;
  a modified layer forming step of applying said pulsed laser beam to said workpiece from the side of said incident surface in the condition where a focal point of said pulsed laser beam is set inside said workpiece after performing said coating step, thereby forming a modified layer inside said workpiece; and
  a dividing step of applying an external force to said workpiece after performing said modified layer forming step, thereby dividing said workpiece as starting from said modified layer formed inside said workpiece as a break start point.

2. The workpiece dividing method according to claim 1, wherein said incident surface is on a back side of said workpiece.

\* \* \* \* \*